United States Patent
Chiang et al.

(10) Patent No.: US 9,748,183 B2
(45) Date of Patent: Aug. 29, 2017

(54) FABRICATION METHOD OF SEMICONDUCTOR PACKAGE

(71) Applicant: Siliconware Precision Industries Co., Ltd., Taichung (TW)

(72) Inventors: Ching-Wen Chiang, Taichung (TW); Cheng-Hao Ciou, Taichung (TW); Cheng-Chieh Wu, Taichung (TW); Kuang-Hsin Chen, Taichung (TW); Hsien-Wen Chen, Taichung (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 0 days.

(21) Appl. No.: 15/455,704

(22) Filed: Mar. 10, 2017

(65) Prior Publication Data

US 2017/0186703 A1    Jun. 29, 2017

Related U.S. Application Data

(62) Division of application No. 14/919,867, filed on Oct. 22, 2015, now Pat. No. 9,627,307.

(30) Foreign Application Priority Data

Nov. 12, 2014   (TW) .............................. 103139187 A

(51) Int. Cl.
*H01L 21/78* (2006.01)
*H01L 23/00* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............ H01L 23/3121; H01L 23/3128; H01L 23/5389; H01L 24/80–24/90; H01L 24/93; H01L 24/95–24/97
See application file for complete search history.

(56) References Cited

U.S. PATENT DOCUMENTS

| | | | |
|---|---|---|---|
| 2010/0013087 A1* | 1/2010 | England | H01L 24/19 257/700 |
| 2014/0217597 A1 | 8/2014 | Lin et al. | |

* cited by examiner

*Primary Examiner* — Daniel Shook
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, including: an insulating base body having a first surface with an opening and a second surface opposite to the first surface; an insulating extending body extending outward from an edge of the first surface of the insulating base body, wherein the insulating extending body is less in thickness than the insulating base body; an electronic element having opposite active and inactive surfaces and disposed in the opening with its inactive surface facing the insulating base body; a dielectric layer formed in the opening of the insulating base body and on the first surface of the insulating base body, the insulating extending body and the active surface of the electronic element; and a circuit layer formed on the dielectric layer and electrically connected to the electronic element. The configuration of the insulating layer of the invention facilitates to enhance the overall structural rigidity of the package.

11 Claims, 6 Drawing Sheets

(51) Int. Cl.
*H01L 21/48* (2006.01)
*H01L 21/56* (2006.01)
*H01L 23/538* (2006.01)

(52) U.S. Cl.
CPC .......... *H01L 21/561* (2013.01); *H01L 21/568* (2013.01); *H01L 23/5383* (2013.01); *H01L 23/5386* (2013.01)

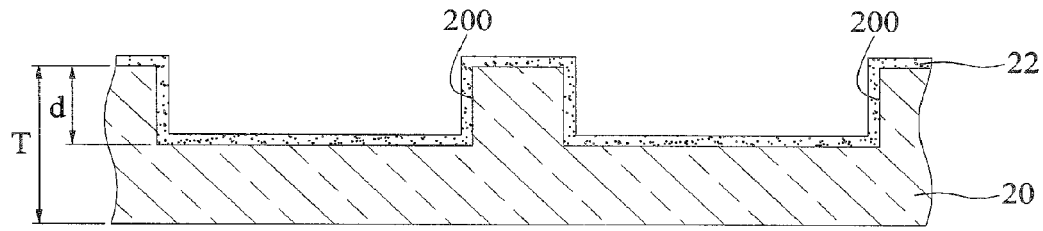
FIG.2A
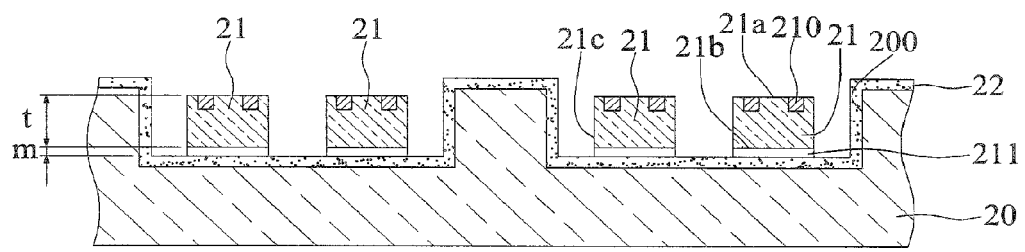
FIG.2B
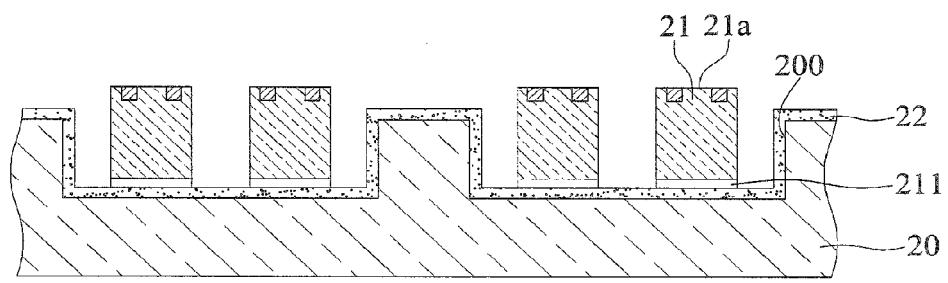
FIG.2B'
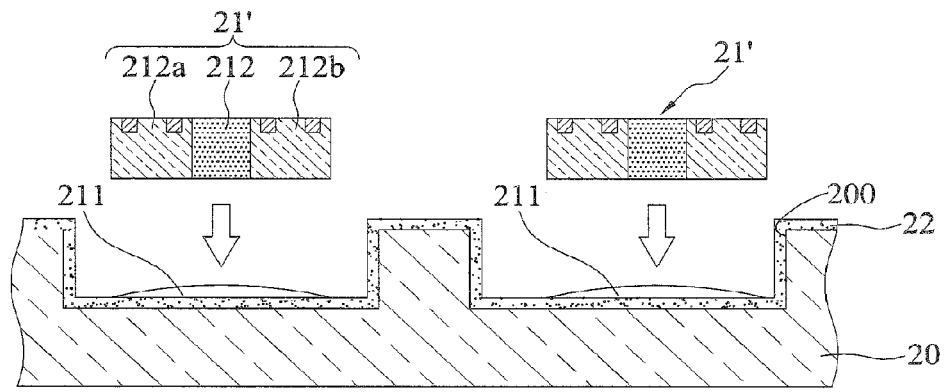
FIG.2B"

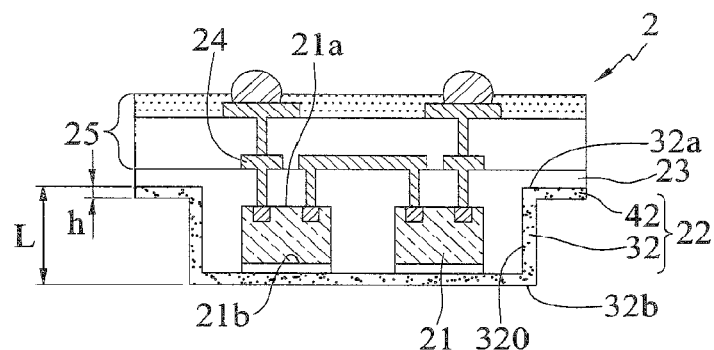
FIG.2G
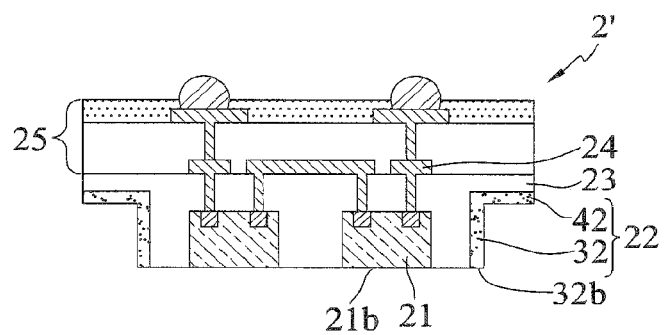
FIG.2G'
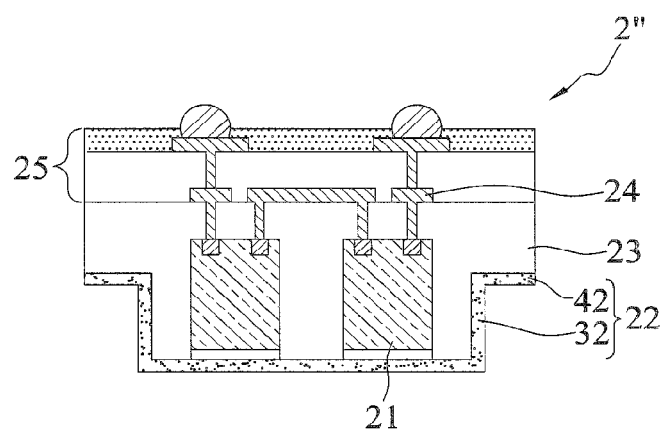
FIG.2G"

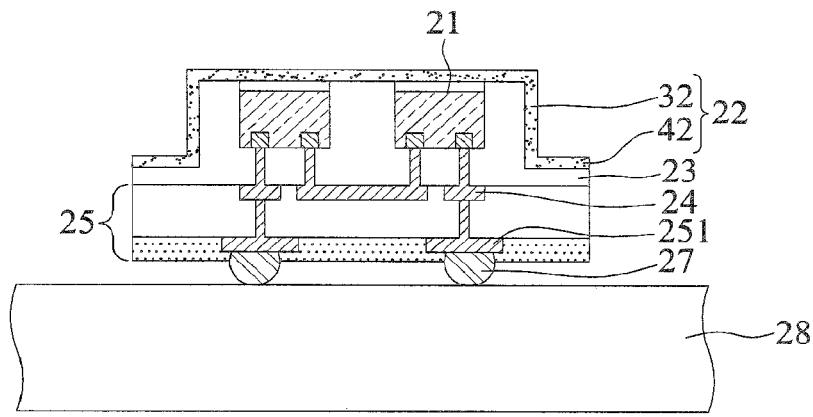
FIG.2H
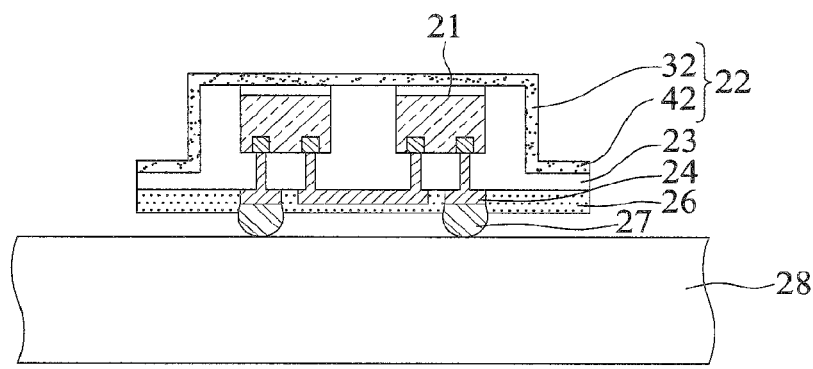
FIG.2H'
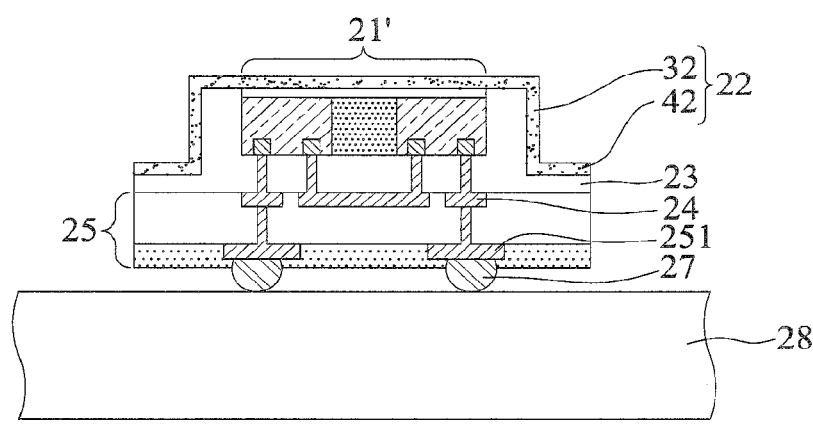
FIG.2H"

FABRICATION METHOD OF SEMICONDUCTOR PACKAGE

CROSS-REFERENCE TO RELATED APPLICATIONS

This application is a divisional of copending application U.S. Ser. No. 14/919,867, filed on Oct. 22, 2015, which claims under 35 U.S.C. §119(a) the benefit of Taiwanese Application No. 103139187, filed Nov. 12, 2014, the entire contents of which are incorporated herein by reference.

BACKGROUND OF THE INVENTION

1. Field of the Invention

The present invention relates to semiconductor packages, and more particularly, to a semiconductor package having wafer level circuits and a fabrication method thereof.

2. Description of Related Art

Along with the rapid development of electronic industries, electronic products are developed toward the trend of multi-function and high performance. Accordingly, there have been developed various types of flip-chip packaging modules such as chip scale packages (CSPs), direct chip attached (DCA) packages and multi-chip modules (MCM), and 3D IC chip stacking technologies.

FIG. 1 is a schematic cross-sectional view of a conventional semiconductor package 1. Referring to FIG. 1, the semiconductor package 1 has a silicon interposer 10 provided between a packaging substrate 18 and a semiconductor chip 11. The silicon interposer 10 has a plurality of through silicon vias (TSVs) 100 and an RDL (redistribution layer) structure 15 formed on the TSVs 100. The RDL structure 15 of the silicon interposer 10 is electrically connected to bonding pads 180 of the packaging substrate 18 through a plurality of conductive elements 17. The bonding pads 180 of the packaging substrate 18 have a large pitch therebetween. Further, an adhesive material 12 is formed to encapsulate the conductive elements 17. The TSVs 100 of the silicon interposer 10 is electrically connected to electrode pads 110 of the semiconductor chip 11 through a plurality of solder bumps 19. The electrode pads 110 have a small pitch therebetween. Further, an adhesive material 12 is formed to encapsulate the solder bumps 19.

Conventionally, if the semiconductor chip 11 is directly attached to the packaging substrate 18, a big CTE (Coefficient of Thermal Expansion) mismatch between the semiconductor chip 11 and the packaging substrate 18 adversely affects the formation of joints between the solder bumps 19 of the semiconductor chip 11 and the bonding pads 180 of the packaging substrate 18, thus easily resulting in delamination of the solder bumps 19 from the packaging substrate 18. On the other hand, along with increased integration of integrated circuits, the CTE mismatch between the semiconductor chip 11 and the packaging substrate 18 induces more thermal stresses and leads to more serious warpage, thereby reducing the reliability of electrical connection between the semiconductor chip 11 and the packaging substrate 18 and resulting in failure of a reliability test.

Therefore, the silicon interposer 10 close in material to the semiconductor chip 11 is disposed between the semiconductor chip 11 and the packaging substrate 18 so as to effectively overcome above-described drawbacks.

However, to form the TSVs 100 of the silicon interposer 10, a plurality of through holes need to be formed in the silicon interposer 10 and filled with metal, thus incurring a high fabrication cost. For example, for a 12-inch wafer, the TSV cost occupies about 40 to 50% of the total cost for fabricating the silicon interposer 10 (not including labor cost). Consequently, the cost of the final product is increased.

Further, the techniques for fabricating the silicon interposer 10 are difficult to perform, thus resulting in a low yield of the semiconductor package 1.

Therefore, how to overcome the above-described drawbacks has become critical.

SUMMARY OF THE INVENTION

In view of the above-described drawbacks, the present invention provides a semiconductor package, which comprises: an insulating base body having a first surface with an opening formed therein and a second surface opposite to the first surface; an insulating extending body extending outward from an edge of the first surface of the insulating base body, wherein the insulating extending body is less in thickness than the insulating base body; an electronic element having opposite active and inactive surfaces, wherein the electronic element is disposed in the opening of the insulating base body with the inactive surface of the electronic element facing the insulating base body; a dielectric layer formed in the opening of the insulating base body and on the first surface of the insulating base body, the insulating extending body and the active surface of the electronic element; and a circuit layer formed on the dielectric layer and electrically connected to the electronic element.

In the above-described package, the insulating extending body and the insulating base body can be integrally formed.

In the above-described package, the inactive surface of the electronic element can be bonded to the opening of the insulating base body through a bonding layer.

In the above-described package, the inactive surface of the electronic element can be exposed from the second surface of the insulating base body.

In the above-described package, a portion of the circuit layer can penetrate the dielectric layer so as to be exposed from the insulating extending body.

The present invention further provides a method for fabricating a semiconductor package, which comprises the steps of: providing a carrier having a recess, wherein the carrier and the recess have an insulating layer formed thereon; disposing at least an electronic element on the insulating layer in the recess of the carrier; forming a dielectric layer on the insulating layer and the electronic element, wherein the dielectric layer encapsulates the electronic element; forming on the dielectric layer a circuit layer electrically connected to the electronic element; and removing the carrier to expose the insulating layer.

In the above-described method, the carrier can be made of a silicon-containing substrate.

In the above-described method, the carrier can be removed by wet etching using the insulating layer as an etch stop layer In the above-described method, the carrier can have a plurality of recesses, and the method can further comprise performing a singulation process after removing the carrier.

In the above-described method, the electronic element can have opposite active and inactive surfaces, and the inactive surface of the electronic element can be bonded to the insulating layer in the recess through a bonding layer.

After removing the carrier, the above-described method can further comprise removing a portion of the insulating layer and the bonding layer so as to expose the inactive surface of the electronic element from the insulating layer.

After removing the carrier, the method can further comprise removing a portion of the insulating layer so as to expose the circuit layer form the insulating layer.

In the above-described package and method, the insulating layer (or the insulating base body and the insulating extending body of the package) can be made of silicon oxide or silicon nitride.

In the above-described package and method, an RDL structure can be formed on the dielectric layer and the circuit layer and electrically connected to the circuit layer. Further, a packaging substrate can be disposed on and electrically connected to the RDL structure.

In the above-described package and method, a packaging substrate can be disposed on and electrically connected to the circuit layer.

Therefore, through configuration of the insulating layer, the present invention enhances the overall structural rigidity of the semiconductor package, reduces the thickness of the dielectric layer and avoids warping of the semiconductor package caused by temperature variation.

Further, the present invention dispenses with the conventional silicon interposer, thereby greatly reducing the fabrication cost, simplifying the fabrication process and improving the product yield.

BRIEF DESCRIPTION OF DRAWINGS

FIGS. 2A to 2H are schematic cross-sectional views showing a method for fabricating a semiconductor package according to a first embodiment of the present invention, wherein FIGS. 2B' and 2B" show other embodiments of FIG. 2B, FIGS. 2G' and 2G" show other embodiments of FIG. 2G, and FIGS. 2H' and 2H" show other embodiments of FIG. 2H.

DETAILED DESCRIPTION OF PREFERRED EMBODIMENTS

Figure 1:
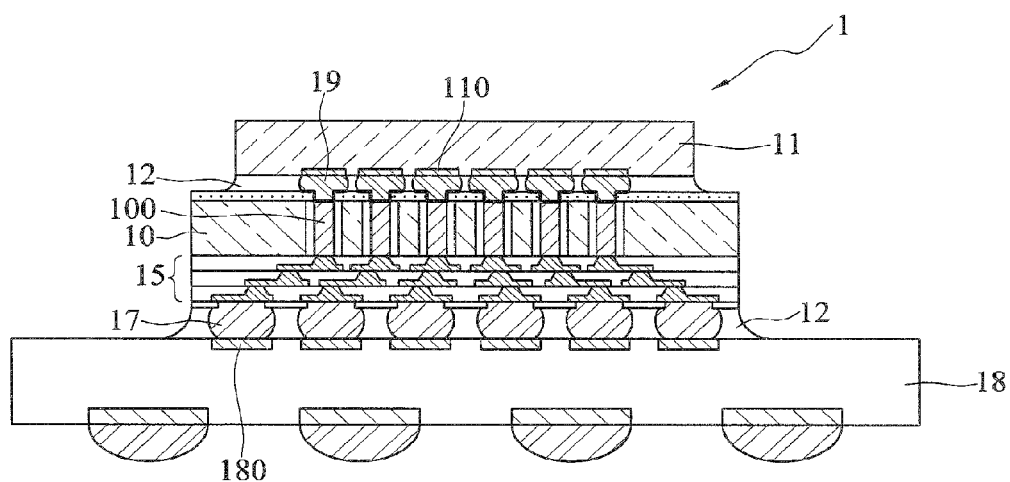
FIG. 1 is a schematic cross-sectional view of a conventional semiconductor package.

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "a" etc. are merely for illustrative purposes and should not be construed to limit the scope of the present invention.

FIGS. 2A to 2H are schematic cross-sectional views showing a method for fabricating a semiconductor package 2 according to a first embodiment of the present invention.

Referring to FIG. 2A, a carrier 20 having a plurality of recesses 200 is provided. The carrier 20 and the recesses 200 have an insulating layer 22 formed thereon.

In the present embodiment, the carrier 20 is a silicon-containing substrate, and the insulating layer 22 is made of silicon oxide such as $SiO_2$ or silicon nitride such as $Si_xN_y$.

The depth d of the recesses 200 is at most half of the thickness T of the carrier 20.

Referring to FIG. 2B, a plurality of electronic elements 21 are disposed on the insulating layer 22 in the recesses 200 of the carrier 20.

In the present embodiment, each of the electronic elements 21 has an active surface 21a with a plurality of electrode pads 210 and an inactive surface 21b opposite to the active surface 21a. The inactive surface 21b of the electronic element 21 is bonded to the insulating layer 22 through a bonding layer 211, and the electronic element 21 does not protrude above the corresponding recess 200. The thickness t of the electronic element 21 is in a range of 10 to 300 um, preferably, in a range of 20 to 150 um. The thickness m of the bonding layer 211 is in a range of 5 to 25 um.

In another embodiment, referring to FIG. 2B', the electronic elements 21 protrude above the recesses 200.

Further, the bonding layer 211 is, for example, a die attach film. The bonding layer 211 can be formed on the inactive surfaces 21b of the electronic elements 21 and the electronic elements 21 are then bonded to the insulating layer 22 in the recesses 200 through the bonding layer 211. Alternatively, referring to FIG. 2B", the bonding layer 211 can be formed on the insulating layer 22 in the recesses 200 by such as dispensing and the electronic elements 21 are then bonded to the bonding layer 211.

Each of the electronic elements 21 is an active element such as a semiconductor chip, a passive element such as a resistor, a capacitor or an inductor, or a combination thereof. In the present embodiment, each of the electronic elements 21 is an active element having a single chip structure, and each recess 200 receives two electronic elements 21 therein.

In another embodiment, referring to FIG. 2B", each of the electronic elements 21' is an active element such as a multi-chip module. For example, two chips 212a, 212b are bonded together by a bonding material 212 (for example, an epoxy resin) so as to form a module, and the module is then disposed in a recess 200.

Figure 2C:
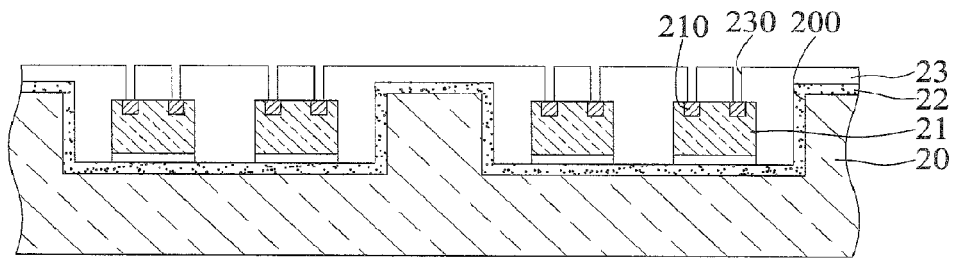

Referring to FIG. 2C, continued from FIG. 2B, a dielectric layer 23 is formed on the insulating layer 22 and the electronic elements 21, and a plurality of via holes 230 are formed in the dielectric layer 23 to expose the electrode pads 210 of the electronic elements 21.

In the present embodiment, the dielectric layer 23 is filled in the recesses 200 of the carrier 20 to encapsulate the electronic elements 21.

The dielectric layer 23 is made of a photosensitive material such as polyimide (PI), polybenzoxazole (PBO) or benzocyclobutene (BCB). As such, the dielectric layer 23 and the insulating layer 22 are made of different materials.

The via holes 230 are formed by a chemical method such as etching or a physical method such as laser drilling.

Figure 2D:
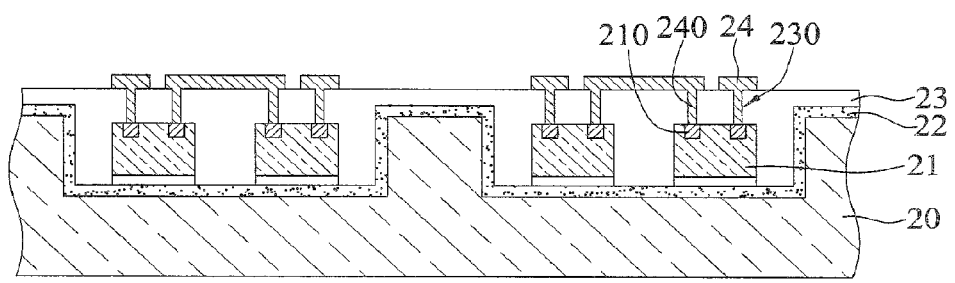

Referring to FIG. 2D, a circuit layer 24 is formed on the dielectric layer 23, and a plurality of conductive vias 240 are formed in the via holes 230 for electrically connecting the circuit layer 24 and the electrode pads 210 of the electronic elements 21.

In the present embodiment, the circuit layer 24 includes wafer level circuits instead of packaging substrate level circuits. The packaging substrate level circuits have a minimum line width/pitch of 12/12 um. But the wafer level circuits having a minimum line width/pitch below 3/3 um can be fabricated through semiconductor processes.

Figure 2E:
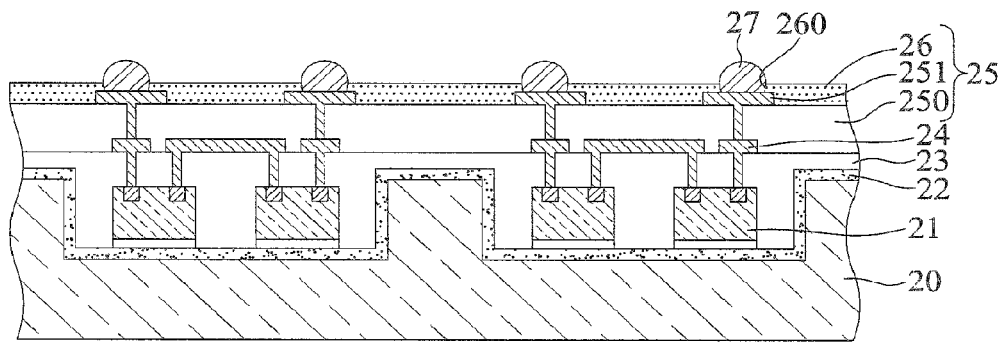

Referring to FIG. 2E, an RDL process is performed to form an RDL structure 25 on the dielectric layer 23 and the circuit layer 24. The RDL structure 25 is electrically connected to the circuit layer 24.

In the present embodiment, the RDL structure 25 has a dielectric portion 250, a circuit portion 251 and an insulating layer 26 stacked on one another. A plurality of openings 260 are formed in the insulating layer 26 to expose the circuit portion 251, and a plurality of conductive elements 27 such as solder balls are formed on the circuit portion 251 in the openings 260.

Figure 2F:
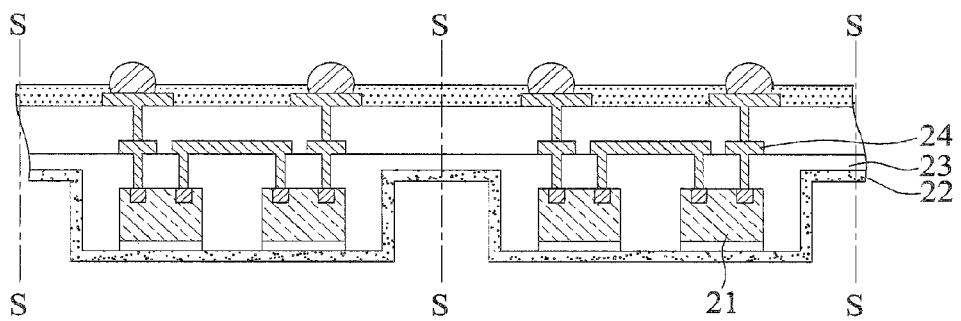

Referring to FIG. 2F, the carrier 20 is removed to expose the insulating layer 22.

In the present embodiment, the carrier 20 is removed by wet etching using an etching solution such as TMAH or KOH, and the insulating layer 22 serves as an etch stop layer.

Referring to FIG. 2G, a singulation process is performed along a cutting path S of FIG. 2F, thereby forming a semiconductor package 2 of the present invention.

In the present embodiment, the insulating layer 22 has an insulating base body 32 and an insulating extending body 42 extending from the insulating base body 32. The insulating base body 32 has a first surface 32a and a second surface 32b opposite to the first surface 32a. An opening 320 is formed in the first surface 32a of the insulating base body 32 and receives the electronic elements 21 therein. The insulating extending body 42 extends outward from an edge of the first surface 32a of the insulating base body 32, and the thickness h of the insulating extending body 42 is less than the thickness L of the insulating base body 32.

In another embodiment, referring to FIG. 2G', after the singulation process, a portion of the insulating base body 32 and the bonding layer 211 are removed from the second surface 32b of the insulating base body 32 so as to expose the inactive surfaces 21b of the electronic elements 21. As such, a semiconductor package 2' is obtained.

In another embodiment, referring to FIG. 2G'', if the process is continued from FIG. 2B', a semiconductor package 2'' is obtained.

Referring to FIG. 2H, continued from FIG. 2G, a packaging substrate 28 is disposed on the RDL structure 25 through the conductive elements 27, and the circuit portion 251 of the RDL structure 25 is electrically connected to the packaging substrate 28.

In another embodiment, referring to FIG. 2H', continued from FIG. 2D, after formation of the circuit layer 24, neither the dielectric portion 250 nor the circuit portion 251 is formed. Instead, the insulating layer 26 is directly formed on the circuit layer 24 and has a plurality of openings 260 exposing portions of the circuit layer 24. As such, the conductive elements 27 are formed on the exposed portions of the circuit layer 24. Then, a singulation process is performed. Thereafter, the packaging substrate 28 is disposed on and electrically connected to the circuit layer 24 through the conductive elements 27.

In another embodiment, referring to FIG. 2H'', the process is continued from FIG. 2B'' so as to form a semiconductor package.

Figure 3A:
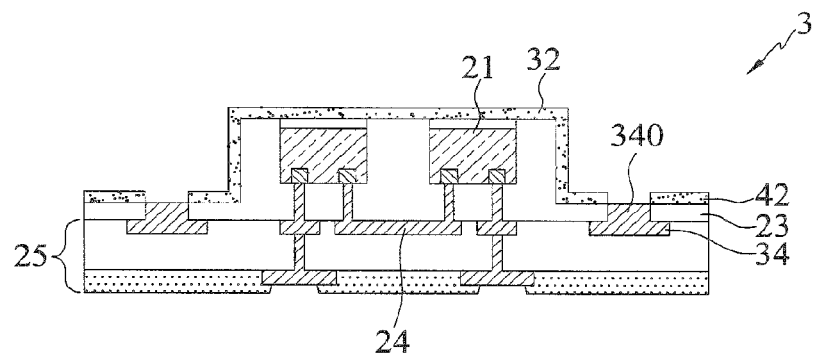
FIGS. 3A and 3B are schematic cross-sectional views showing a method for fabricating a semiconductor package according to a second embodiment of the present invention.
Figure 3B:
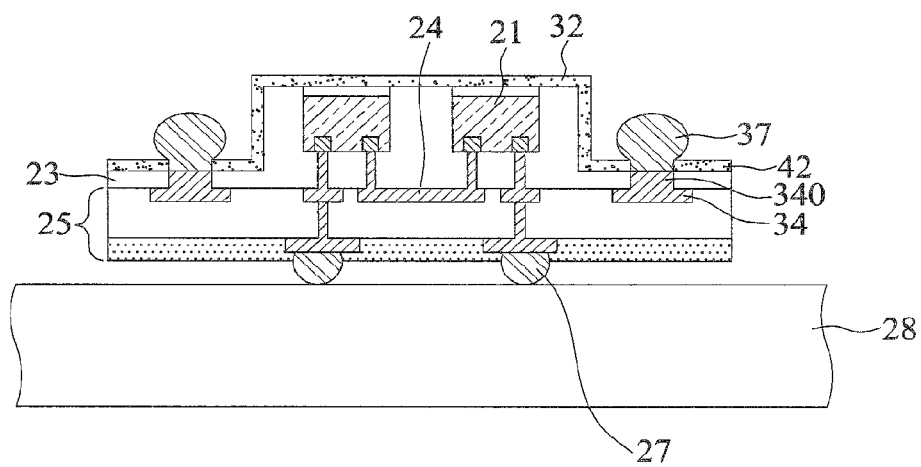

FIGS. 3A and 3B are schematic cross-sectional views showing a method for fabricating a semiconductor package 3 according to a second embodiment of the present invention. The present embodiment differs from the first embodiment in the configuration of the insulating extending body.

Referring to FIG. 3A, during formation of the circuit layer 24, a circuit layer 34 is further formed on the insulating extending body 42. The circuit layer 34 has a plurality of conductors 340 penetrating the dielectric layer 23. As such, after the carrier 20 is removed, portions of the insulating extending body 42 are removed to expose the conductors 340 of the circuit layer 34.

Referring to FIG. 3B, a plurality of conductive bumps 37 are formed on the exposed conductors 340 for bonding with an electronic device such as a semiconductor chip (not shown).

In the present invention, since the dielectric material 23 is made of a photosensitive material such as polyimide (PI), polybenzoxazole (PBO) or benzocyclobutene (BCB), it is generally required to have a certain thickness to achieve a preferred mechanical property such as structural strength for encapsulating the electronic elements 21, 21'. In addition, a big CTE mismatch between the dielectric layer 23 and the packaging substrate 28 easily causes warping of the semiconductor package when the packaging substrate 28 and the dielectric layer 23 are bonded together and a high temperature process is performed.

Therefore, the insulating layer 22 of the present invention is provided to reduce the thickness of the dielectric layer 23 and avoid warping of the semiconductor package 2, 2', 2'', 3 caused by temperature variation.

Further, by dispensing with the conventional silicon interposer, the present invention greatly reduces the fabrication cost of the semiconductor package 2, 2', 2'', 3, simplifies the fabrication process and improves the product yield.

Also, by dispensing with the conventional silicon interposer, the present invention reduces the thickness of the semiconductor package 2, 2', 2'', 3.

Furthermore, since the electronic elements 21, 21' of the semiconductor package 2, 2', 2'', 3 do not need the conventional silicon interposer for signal transmission, the present invention improves the signal transmission speed.

The present invention provides a semiconductor package 2, 2', 2'', 3, which has: an insulating base body 32 having a first surface 32a with an opening 320 formed therein and a second surface 32b opposite to the first surface 32a; an insulating extending body 42 extending outward from an edge of the first surface 32a of the insulating base body 32, wherein the thickness h of the insulating extending body 42 is less than the thickness L of the insulating base body 32; at least an electronic element 21, 21' having opposite active and inactive surfaces 21a, 21b, wherein the electronic element 21, 21' is disposed in the opening 320 of the insulating base body 32 with the inactive surface 21a of the electronic element 21, 21' facing the insulating base body 32; a dielectric layer 23 formed in the opening 320 of the insulating base body 32 and on the first surface 32a of the insulating base body 32, the insulating extending body 42 and the active surface 21a of the electronic element 21, 21'; and a circuit layer 24, 34 formed on the dielectric layer 23 and electrically connected to the electronic element 21, 21'.

The electronic element 21, 21' is an active element, a passive element or a combination thereof.

The dielectric layer 23 is made of a material different from those of the insulating base body 32 and the insulating extending body 42.

The circuit layer 24 has a plurality of conductive vias 240 formed in the dielectric layer 23 for electrically connecting the circuit layer 24 and the electronic element 21, 21'.

In an embodiment, the insulating extending body 42 and the insulating base body 32 are integrally formed.

In en embodiment, the inactive surface 21b of the electronic element 21, 21' is bonded to the opening 320 of the insulating base body 32 through a bonding layer 211.

In an embodiment, the inactive surface 21b of the electronic element 21 is exposed from the second surface 32b of the insulating base body 32.

In an embodiment, the circuit layer 34 has conductors 340 penetrating the dielectric layer 23 and exposed from the insulating extending body 42.

In an embodiment, the semiconductor package 2, 2', 2'', 3 further has an RDL structure 25 formed on the dielectric layer 23 and the circuit layer 24, 34 and electrically connected to the circuit layer 24, 34, and a packaging substrate 28 disposed on and electrically connected to the RDL structure 25.

In an embodiment, the semiconductor package 2, 2', 2", 3 further has a packaging substrate 28 disposed on and electrically connected to the circuit layer 24, 34.

Therefore, through configuration of the insulating layer, the present invention enhances the overall structural rigidity of the semiconductor package, reduces the thickness of the dielectric layer and avoids warping of the semiconductor package caused by temperature variation.

Further, the present invention dispenses with the conventional silicon interposer, thereby greatly reducing the fabrication cost, simplifying the fabrication process and improving the product yield.

Furthermore, by dispensing with the conventional silicon interposer, the present invention reduces the overall thickness of the final products and improves the signal transmission speed of the electronic elements.

In addition, since the carrier is made of a silicon-containing substrate, it is not easy to warp.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a semiconductor package, comprising the steps of:
   providing a carrier having a recess, wherein the carrier and the recess have an insulating layer formed thereon;
   disposing at least an electronic element on the insulating layer in the recess of the carrier;
   forming a dielectric layer on the insulating layer and the electronic element, wherein the dielectric layer encapsulates the electronic element;
   forming on the dielectric layer a circuit layer electrically connected to the electronic element; and
   removing the carrier to expose the insulating layer.

2. The method of claim 1, wherein the carrier is made of a silicon-containing substrate.

3. The method of claim 1, wherein the carrier has a plurality of recesses, and the method further comprises performing a singulation process after removing the carrier.

4. The method of claim 1, wherein the insulating layer is made of silicon oxide or silicon nitride.

5. The method of claim 1, wherein the carrier is removed by wet etching using the insulating layer as an etch stop layer.

6. The method of claim 1, wherein the electronic element has opposite active and inactive surfaces, and the inactive surface of the electronic element is bonded to the insulating layer in the recess through a bonding layer.

7. The method of claim 6, after removing the carrier, further comprising removing a portion of the insulating layer and the bonding layer so as to expose the inactive surface of the electronic element from the insulating layer.

8. The method of claim 1, after removing the carrier, further comprising removing a portion of the insulating layer so as to expose the circuit layer form the insulating layer.

9. The method of claim 1, further comprising forming an RDL structure on the dielectric layer and the circuit layer, wherein the RDL structure is electrically connected to the circuit layer.

10. The method of claim 9, after removing the carrier, further comprising disposing and electrically connecting a packaging substrate to the RDL structure.

11. The method of claim 1, after removing the carrier, further comprising disposing and electrically connecting a packaging substrate to the circuit layer.

* * * * *